(12) United States Patent
Jang et al.

(10) Patent No.: US 7,193,315 B2
(45) Date of Patent: Mar. 20, 2007

(54) TEST VEHICLE GRID ARRAY PACKAGE

(75) Inventors: Chae Kyu Jang, Kyoungki-do (KR); Sang Kwon Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 9 days.

(21) Appl. No.: 10/618,955

(22) Filed: Jul. 14, 2003

(65) Prior Publication Data
US 2004/0173887 A1    Sep. 9, 2004

(30) Foreign Application Priority Data
Mar. 4, 2003  (KR) ...................... 10-2003-0013266

(51) Int. Cl.
*H01L 23/12* (2006.01)
*H01L 23/48* (2006.01)
*H01L 23/52* (2006.01)

(52) U.S. Cl. ................ 257/704; 257/784; 257/780

(58) Field of Classification Search ................ 257/704, 257/784, 787, 780
See application file for complete search history.

(56) References Cited

U.S. PATENT DOCUMENTS

| | | | |
|---|---|---|---|
| 5,416,358 A * | 5/1995 | Ochi et al. ................ | 257/666 |
| 5,642,261 A | 6/1997 | Bond et al. | |
| 5,726,493 A | 3/1998 | Yamashita et al. | |
| 5,986,340 A * | 11/1999 | Mostafazadeh et al. ..... | 257/713 |
| 6,084,297 A * | 7/2000 | Brooks et al. .............. | 257/698 |
| 6,133,064 A * | 10/2000 | Nagarajan et al. .......... | 438/106 |
| 6,416,332 B1 | 7/2002 | Carron et al. | |
| 6,448,647 B1 | 9/2002 | Kurita et al. | |
| 6,522,018 B1 | 2/2003 | Tay et al. | |
| 6,544,812 B1 | 4/2003 | Camenforte et al. | |
| 2004/0038442 A1* | 2/2004 | Kinsman ...................... | 438/64 |

FOREIGN PATENT DOCUMENTS

| | | |
|---|---|---|
| JP | 7283372 | 10/1995 |
| JP | 8046077 | 2/1996 |
| JP | 2000 232181 | 8/2000 |

* cited by examiner

*Primary Examiner*—Nitin Parekh
(74) *Attorney, Agent, or Firm*—Ladas & Parry LLP

(57) ABSTRACT

A TV-BGA package comprises: a PCB having bonding fingers; an adhesive material being coated on an edge of the PCB; a sealing post being adhered on the adhesive material; a semiconductor testing chip having a plurality of bonding pads adhered on the PCB; a plurality of metal wires separately connecting bonding pads of the PCB to the bonding fingers of the PCB; a sealing cap adhered on a sealing post for sealing the semiconductor chip; and a plurality of solder balls adhered to a lower side of the PCB. An extrusion is formed at a upper end of the sealing post, and the sealing cap is adhered on the extrusion of the sealing post. Further, the sealing cap is adhered on the extrusion of the sealing post by a low temperature thermoplastic tape or a material similar to low temperature thermoplastic tape. In the TV-BGA package, a sealing post is adhered on the adhesive material coated on an edge of the PCB, and then a sealing cap is capped on the sealing post, so that a test vehicle is manufactured. Therefore, the TV-BGA package can be easily manufactured and is suitable to test high density and speed elements.

4 Claims, 5 Drawing Sheets

TEST VEHICLE GRID ARRAY PACKAGE

BACKGROUND OF THE INVENTION

1. Field of the Invention

The present invention relates to a test vehicle ball grid array package, and more particularly to a test vehicle ball grid array package which is manufactured to test a semiconductor chip.

2. Description of the Prior Art

As generally known in the art, a semiconductor package is divided into a mass package and a test package. The mass package is manufactured for goods. The test package is manufactured to test a semiconductor chip. A test vehicle package using a ceramic or side bridge package is widely used as the test package.

Hereinafter, a conventional test vehicle ceramic package will be described with reference to FIG. 1.

A semiconductor chip 10 is located at a groove 2 of a substrate. A cap 5 covers the groove 2 in which the semiconductor chip 10 is located. Bonding pads (not shown) of the semiconductor chip 10 and leads 3 of the substrate 1 are connected to each other by a metal wire 4. A lead part extending outward from the substrate 1 is foamed to face the lower direction of the substrate 1.

Such a test vehicle ceramic package is easily able to test a low density and speed element. Testing of the semiconductor chip 1 is performed in a state which contacts leads 3 of the substrate 1 with an electrode of a test PCB.

The conventional test vehicle ceramic package is suitable to test a low density and speed element, but is unsuitable to test a high density and speed element. The reason is as follows. In the conventional test vehicle ceramic package, since metal leads are long, a parasitic capacitance of the conventional test vehicle ceramic package is great. Since a ceramic material, that is, an insulator is inserted between leads, a capacitance of the conventional test vehicle ceramic package is great. Accordingly, during the testing of a high density and speed element, erroneous operation occurs and proper testing is not performed.

Although it is neither shown nor described, a land grid array test vehicle package has been developed to test a high density and speed element such as a RAMbus element. The land grid array test vehicle package is limited to a chip size and in a pad location.

As a result, since the conventional test vehicle ceramic package has a great parasitic inductance and capacitance, it is unsuitable for the conventional test vehicle ceramic package to be used in order to test the density and speed of high-density and high-speed elements.

Furthermore, since a size of the conventional test vehicle ceramic package is twice to three times as great as that of a general package, it is difficult to manufacture the conventional test vehicle ceramic package.

Moreover, the conventional test vehicle ceramic package needs a test PCB. Thus, it creates problems for a manufacturer and increases the production cost.

In order to solve the above problems, conventionally, the testing is performed by means of a decap process for a general package without manufacturing a test package. In the decap process, a generally manufactured package is decapped to expose a semiconductor chip, and an electric signal is applied to each bonding pad of the exposed semiconductor chip to test the semiconductor chip. Since the decap process is added to the conventional method, it is unsuitable in a process side. Since an analysis of a decap area for a defective analysis is poor in reliance and an inaccurate sampling occurs, it is substantially difficult to use the conventional method using the decap process.

SUMMARY OF THE INVENTION

Accordingly, the present invention has been made to solve the above-mentioned problems occurring in the prior art, and an object of the present invention is to provide a test vehicle ball grid array package which is suitable to test a high density and speed element.

In order to achieve the object, there is provided a test vehicle ball grid array package comprising: a PCB having bonding fingers; an adhesive material being coated on an edge of the PCB; a sealing post being adhered on the adhesive material; a semiconductor testing chip having a plurality of bonding pads adhered on the PCB; a plurality of metal wires separately connecting bonding pads of the PCB to the bonding fingers of the PCB; a sealing cap adhered on a sealing post for sealing the semiconductor chip; and a plurality of solder balls adhered to a lower side of the PCB.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
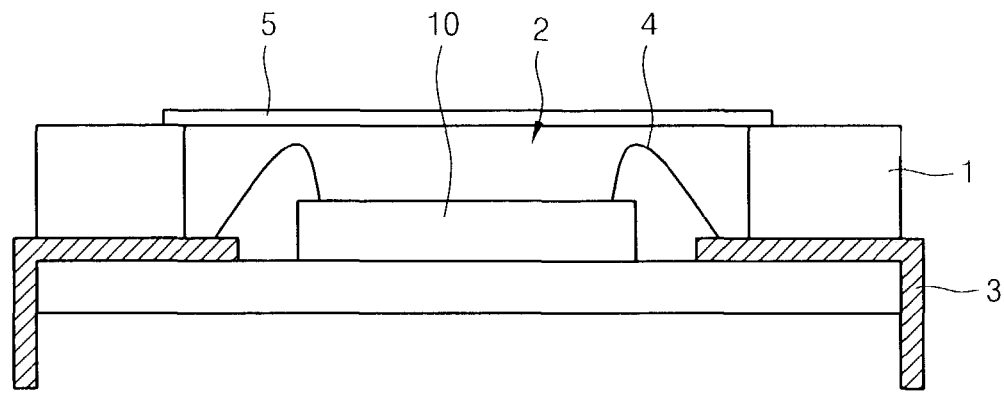
FIG. 1 is a sectional view showing a conventional test vehicle ceramic array package.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 2:
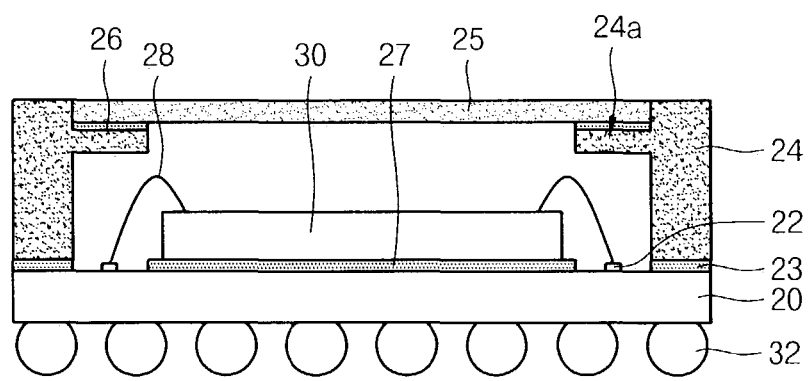
FIG. 2 is a sectional view showing a test vehicle ball grid array package according to an embodiment of the present invention.

FIG. 2 is a sectional view showing a test vehicle ball grid array package according to an embodiment of the present invention.

The test vehicle ball grid array (hereinafter, referred to as "TV-BGA") package includes a PCB 20, an adhesive material 27, a sealing post 24, a semiconductor testing chip 30, a plurality of metal wires 28, and a plurality of solder balls 32.

The PCB 20 has bonding fingers 22. The adhesive material 27 is coated on an edge of the PCB 20. The sealing post 24 is adhered on the adhesive material 27. The semiconductor testing chip 27 includes a plurality of bonding pads (not shown) which are adhered on the PCB 20. A plurality of metal wires 28 separately connect bonding pads of the PCB 20 to the bond fingers of the PCB 20. The sealing cap 25 is adhered on a sealing post for sealing the semiconductor test chip 30. A plurality of solder balls 32 are adhered to a lower side of the PCB 20 to be connected to a circuit pattern (not shown). The solder balls 32 function as means for mounting the PCB to an external device.

The bonding fingers 22 are connected to bonding pads of the semiconductor chip 30 by means of a gold wire 28 or a material similar to the gold wire 28 and functions as an electrode of the PCB 20. Each of the bonding fingers 22 can take any reasonable shape, rectangle, triangle, circle, or shape so long as they are sufficient for wire bonding.

Each of the sealing post 24 and the sealing cap 25 is made from non-conductive material or a similar material. The sealing post 24 is adhered on the PCB 20 by means of a material similar to an adhesive tape. The sealing cap 25 has an extrusion 24a which is formed thereon so that the sealing cap 25 is easily attached to the sealing post 24 by means of the extrusion 24a. The sealing cap 25 is adhered on the extrusion 24a of the sealing post 23 by an adhesive tape 26, a low temperature thermoplastic tape, or a material similar to the low temperature thermoplastic tape.

A solder ball 32 is attached to a lower surface of the PCB 20 by performing a ball mounting and a reflowing.

By coating a plurality of adhesive tapes on a plurality of parts of the PCB 20 and sealing a semiconductor chip 30 using the sealing post 24 and the sealing cap 25, the TV-BGA package according to the present invention is manufactured. Accordingly, a test vehicle with high-density and high-speed elements can be easily realized. When testing the high density and speed test vehicle, a parasitic inductance and a capacitance should be small. Since the TV-BGA package according to the present invention has no metal lead, a parasitic inductance is small and there is no parasitic capacitance between leads, which allow a test vehicle with high-density and high-speed elements to be obtained.

Also, when analyzing a semiconductor chip, the TV-BGA package does not need a decap method. Thus, it improves the accuracy of analysis.

The TV-BGA package according to the present invention is applied to an edge pad-type chip or a center pad-type chip.

Figure 3:
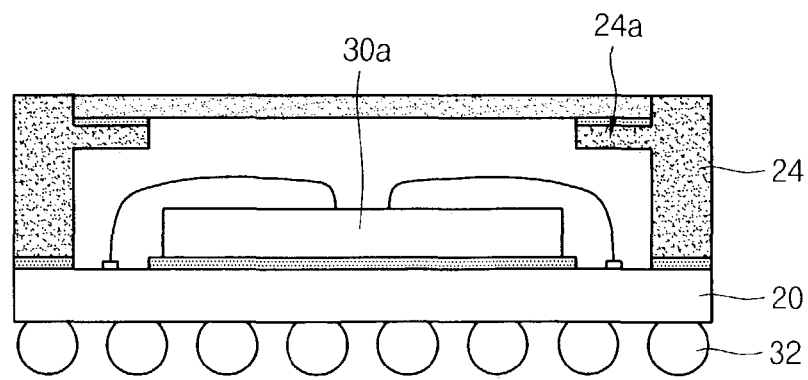
FIG. 3 is a sectional view showing a test vehicle ball grid array package according to another embodiment of the present invention.

FIG. 2 is a sectional view showing a TV-BGA package according to an embodiment of the present invention which is applied to an edge pad-type chip. FIG. 3 is a sectional view showing a TV-BGA package according to another embodiment of the present invention which is applied to the center pad-type chip. As shown in FIGS. 2 and 3, the TV-BGA package is not limited to a location of a chip pad. Numeral reference. 30a represents a center pad-type semiconductor chip. Since there is no limitation on a location of the chip pad in the TV-BGA package according to the present invention, the TV-BGA package can perform even an analysis which it is difficult for a conventional face down BGA type package to perform.

The TV-BGA package according to the present invention shares a predetermined area with a ball grid array test board to be used. Accordingly, the TV-BGA package does not need a special PCB, so it is economical.

In addition, since the TV-BGA package according to the present invention is manufactured by conventional equipment and process without using new equipment and process, it is unnecessary to develop new equipment, thereby providing technical and economical advantages.

Figure 4:
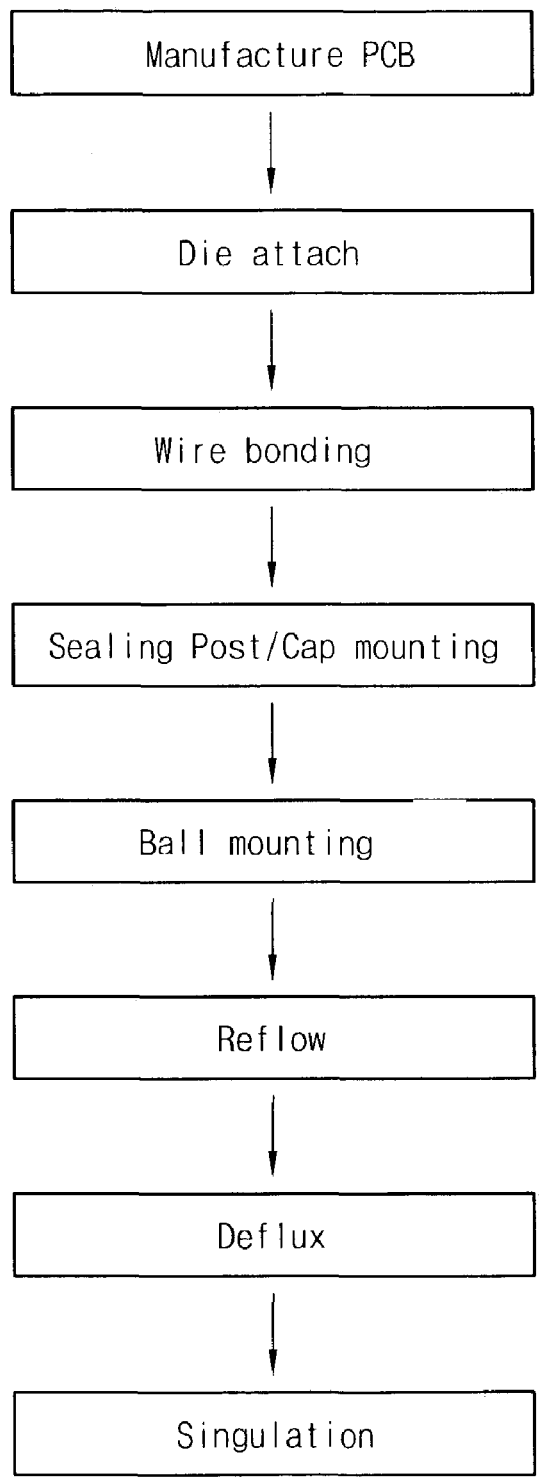
FIG. 4 is a flow chart which illustrates a manufacturing process of a test vehicle ball grid array package according to an embodiment of the present invention.
Figure 5A:
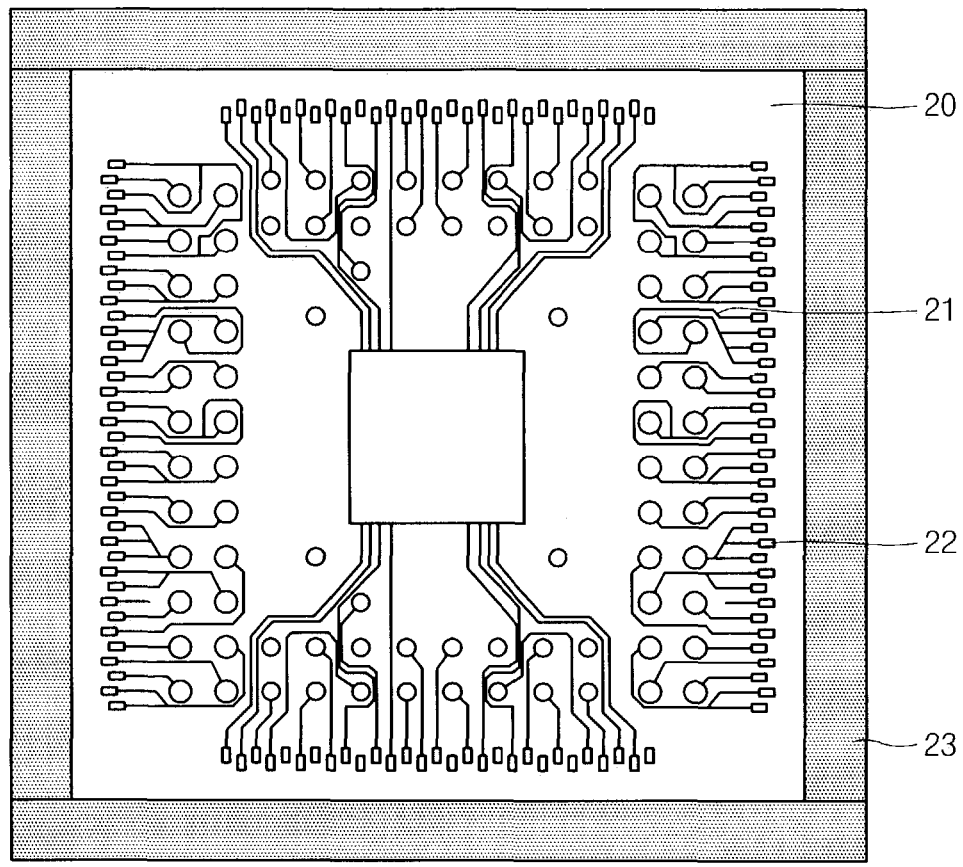
FIGS. 5A to 5D are a top view and sectional views, respectively, which show each step of the manufacturing process.
Figure 5A:
Figure 5B:
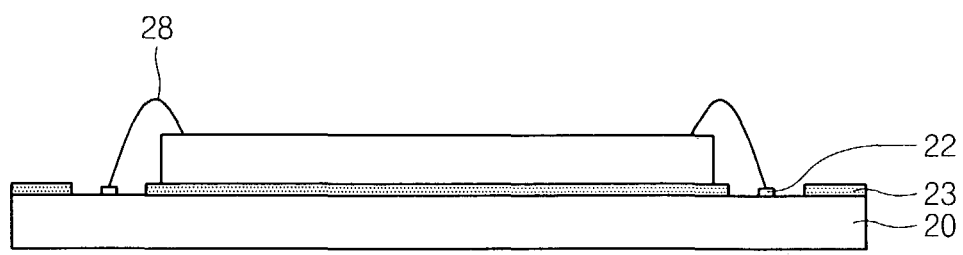
Figure 5C:
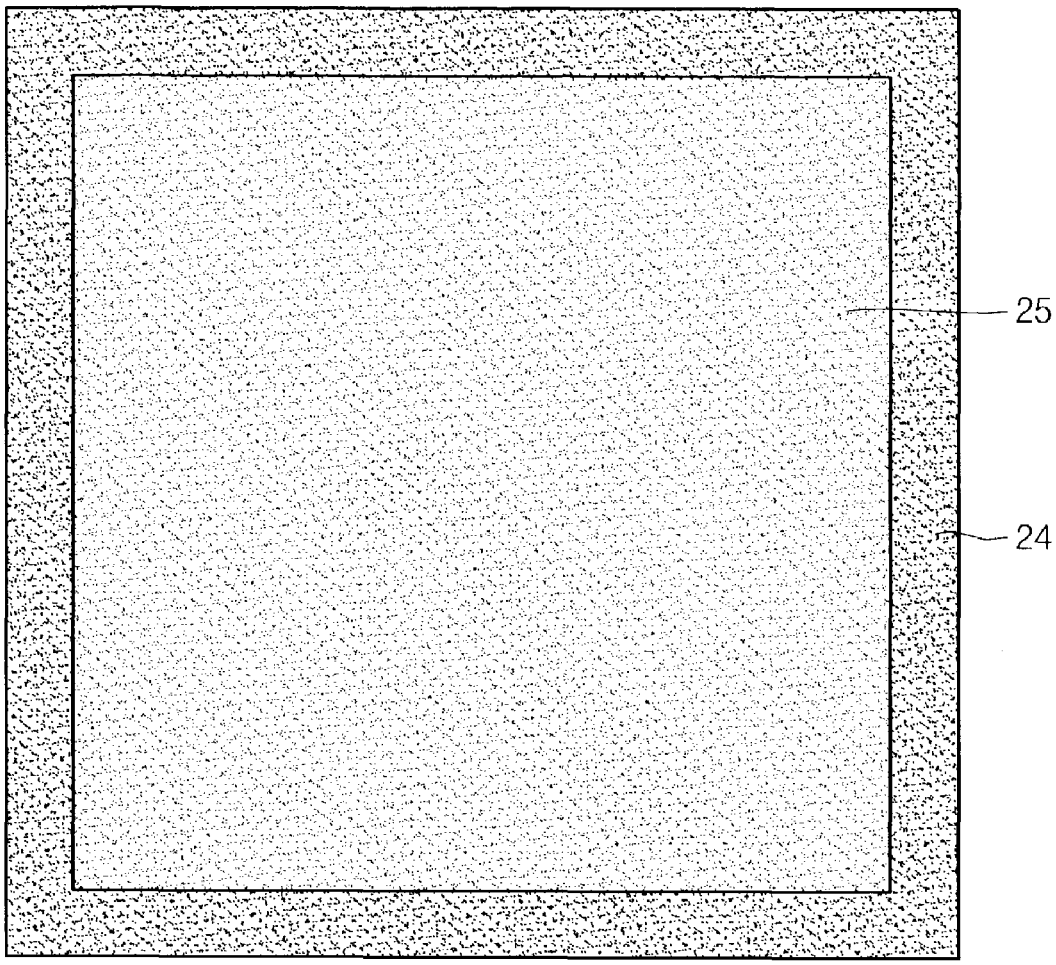
Figure 5C:
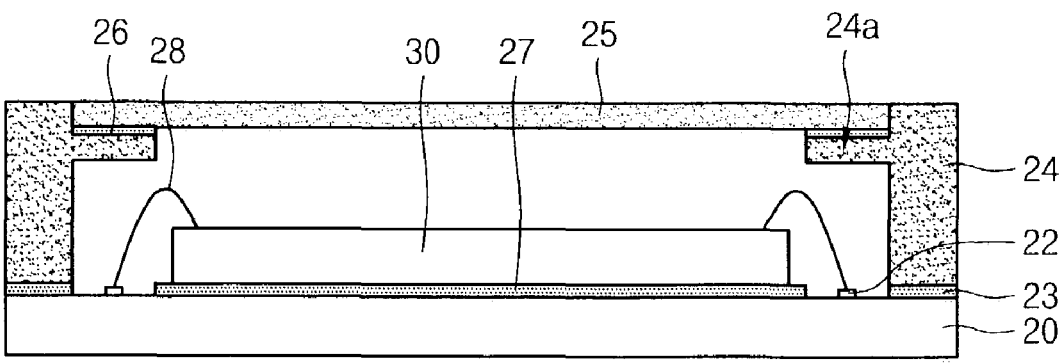
Figure 5D:
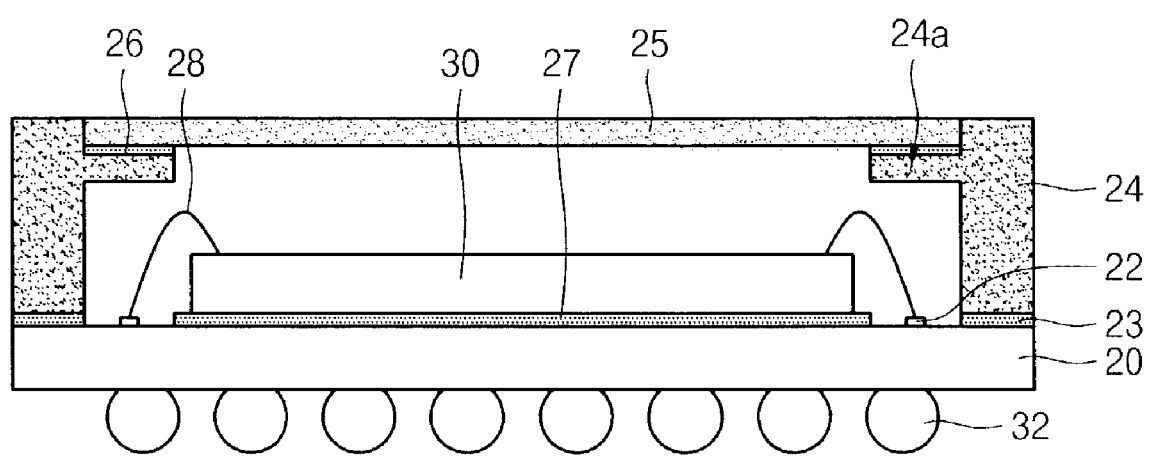

A manufacturing process of a TV-BGA package according to an embodiment of the present invention will now be described with reference to FIGS. 4 to 5D. FIG. 4 is a flow chart which illustrates a manufacturing process of a TV-BGA package according to an embodiment of the present invention. FIGS. 5A to 5D are a top view and sectional views, which show each step of the manufacturing process, respectively.

A PCB 20 having a circuit pattern 21 and a bonding fingers 22 are prepared. The PCB 20 is provided with a stripe level instead of a unit level. An adhesive tape 23 is coated on the PCB 20 around each of the bonding fingers 22. A material similar to the adhesive tape 23, instead of the adhesive tape 23, is coated on the PCB 20 (FIGS. 4 and 5A).

A semiconductor chip 30 is adhered on an area enclosed by bonding fingers 22 using an adhesive material 27 by a die attach process. Through wire bonding, bonding pads of the PCB board 20 are separately and electrically bonded to the bonding fingers 22 of the PCB 20 by a plurality of metal wires 28 (FIGS. 4 and 5B).

In order to seal the semiconductor chip 30, a sealing post 24 is adhered on the adhesive tape 23. The sealing post is made from non-conductive material. The sealing cap 25 is adhered on an extrusion 24a of the sealing post 24 using an adhesive tape 26. The sealing cap 25 is made from non-conductive material. The adhesive tape 26 is made of a low temperature thermoplastic tape or a material similar to the low temperature thermoplastic tape. The low temperature thermoplastic tape or the material similar to the low temperature thermoplastic tape is used to easily adhere and to separate the sealing cap 25 to and from the sealing post 24 (FIGS. 4 and 5C).

After attaching the solder ball 32 to a lower surface of the PCB 20, by performing a reflowing and deflux process therefor, the solder ball 32 is tightly adhered to the lower surface of the PCB 20. Then, a plurality of TV-BGA packages are manufactured with stripe levels. By performing a singulation process for the TV-BGA packages and separating them from TV-BGA packages with unit levels, the TV-BGA package is obtained (FIGS. 4 and 5D).

A method for manufacturing the TV-BGA package according 20 to the present invention includes, as stated above, a step of coating an adhesive tape on the PCB 20 around each of the bonding fingers 22, and a step of mounting the sealing post 24 and the sealing cap 25. Compared to a conventional test vehicle manufacturing method, the method for manufacturing the TV-BGA package according to the present invention does not need an additional process and accompanying equipment other than the two steps mentioned above.

In the TV-BGA package according to the present invention, the same electric feature between a test vehicle and an applied package is obtained to increase the reliability of analysis for picking out defective packages. The reason is that the test vehicle and the applied package have the same raw materials and structures.

Furthermore, since the TV-BGA package according to the present invention is manufactured using a conventional technique and equipment, an additional investment and development are not required thereby providing an economical advantage.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A test vehicle ball grid array package comprising:

a PCB having bonding fingers;

a single semiconductor chip having a plurality of bonding pads adhered on the PCB;

an adhesive material being coated on an edge of the PCB;

one or more sealing posts being adhered on the adhesive material, wherein each sealing post comprises a vertical wall and an extrusion connected to a upper end of the vertical wall, and further wherein the one or more sealing posts enclose the lateral sides of the single semiconductor chip on the PCB such that the extrusions connected to the one or more vertical walls are inside the enclosure without displacing an enclosure space adjacent at least the middle and lower portion of the sealing post;

a plurality of metal wires separately connecting bonding pads of the PCB to the bonding fingers of the PCB;

a sealing cap adhered to the one or more extrusions connect to the vertical wall of the sealing post for sealing the single semiconductor chip from the top; and a plurality of solder balls adhered to a lower side of the PCB.

2. A test vehicle ball grid army package according to claim 1, wherein each of the sealing post and the sealing cap is made from non-conductive material.

3. A test vehicle ball grid array package according to claim 1, wherein the sealing cap is adhered on the extrusion of the sealing post by a low temperature thermoplastic tape or a material similar to low temperature thermoplastic tape.

4. A test vehicle ball grid array package according to claim 1, wherein the semiconductor chip is a center pad-type chip or an edge pad-type chip.

* * * * *